(12) United States Patent  
Bathan et al.

(10) Patent No.: US 7,723,840 B2
(45) Date of Patent: May 25, 2010

(54) INTEGRATED CIRCUIT PACKAGE SYSTEM WITH CONTOURED DIE

(75) Inventors: Henry Descalzo Bathan, Singapore (SG); Lionel Chien Hui Tay, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 364 days.

(21) Appl. No.: 11/759,227

(22) Filed: Jun. 7, 2007

(65) Prior Publication Data

US 2008/0303133 A1    Dec. 11, 2008

(51) Int. Cl.
*H01L 23/12*    (2006.01)
(52) U.S. Cl. .............................. 257/701; 257/E23.008; 257/E23.022
(58) Field of Classification Search .......... 257/E23.008, 257/E23.022; 438/112, 121–127, 977
See application file for complete search history.

(56) References Cited

U.S. PATENT DOCUMENTS

| 6,351,028 | B1 | 2/2002 | Akram |
| 7,067,927 | B1 | 6/2006 | Mostafazadeh |
| 7,129,569 | B2 * | 10/2006 | Punzalan et al. ............ 257/676 |
| 2005/0194698 | A1 | 9/2005 | Shim et al. |
| 2007/0001296 | A1 | 1/2007 | Lee et al. |
| 2007/0111399 | A1 * | 5/2007 | Goida ........................ 438/127 |

* cited by examiner

*Primary Examiner*—Zandra Smith
*Assistant Examiner*—Paul E Patton
(74) *Attorney, Agent, or Firm*—Mikio Ishimaru

(57) ABSTRACT

An integrated circuit package system is provided including forming an external interconnect, providing a contoured integrated circuit die having both an extension and a base portion with the extension extending beyond the base portion, placing the contoured integrated circuit die with the base portion coplanar with the external interconnect and the extension overhanging the external interconnect, connecting the contoured integrated circuit die and the external interconnect, and forming a package encapsulation over the contoured integrated circuit die and the external interconnect with both partially exposed.

20 Claims, 4 Drawing Sheets

INTEGRATED CIRCUIT PACKAGE SYSTEM WITH CONTOURED DIE

TECHNICAL FIELD

The present invention relates generally to an integrated circuit package system, and more particularly to an integrated circuit package system with an encapsulation.

BACKGROUND ART

Modern consumer electronics, such as cellular phones, digital cameras, and music players, are packing more integrated circuits into an ever-shrinking physical space with expectations for decreasing cost. Numerous technologies have been developed to meet these requirements. Some of the research and development strategies focus on new technologies while others focus on improving the existing and mature technologies. Research and development in the existing technologies may take a myriad of different directions. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. Still the demand continues for lower cost, smaller size and more functionality. Continued integration of functions into a single integrated circuit increases the integrated circuit size necessitating a more expensive package or a higher profile package.

Electronic products and integrated circuit inside are subjected to the full range of environments and conditions. This can span negative temperatures, triple digit temperatures, moisture, altitude, high force impacts and repetitive stress. Manufacturing methods need to accommodate both fabrication extremes as well as application or usage extremes. Stresses often result in damage to the integrated circuit package, such as delamination, corrosion, and breakage. This damage causes failures that are sometimes intermittent and hard to detect or analyze.

A variation of existing technologies uses integrated circuit packages with a die-attach paddle. Typically, integrated circuit die mounts on the die-attach paddle, wherein the die-attach paddle provides support and planar rigidity. Although conventional die-attach paddles provide functional utility, they create other problems. For example, the encapsulation may separate from the die-attach, such as epoxy molding compound (EMC) delamination, causing reliability problems, such as test failures in moisture sensitivity level (MSL) test.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming an external interconnect, providing a contoured integrated circuit die having both an extension and a base portion with the extension extending beyond the base portion, placing the contoured integrated circuit die with the base portion coplanar with the external interconnect and the extension overhanging the external interconnect, connecting the contoured integrated circuit die and the external interconnect, and forming a package encapsulation over the contoured integrated circuit die and the external interconnect with both partially exposed.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
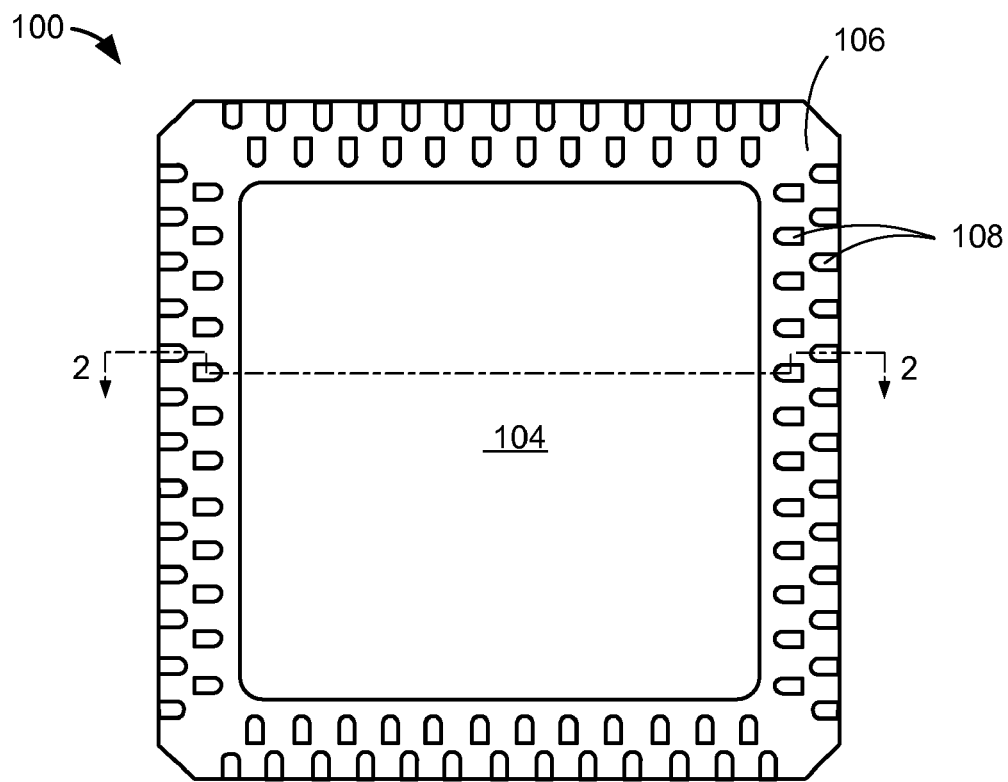
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of an integrated circuit package system 100 in an embodiment of the present invention. The bottom view depicts a contoured integrated circuit die 104, surrounded by a package encapsulation 106, such as an epoxy molding compound. The package encapsulation 106 preferably surrounds and exposes dual rows of external interconnects 108, such as leads.

For illustrative purposes, the integrated circuit package system 100 is shown having the contoured integrated circuit die 104 encapsulated with the external interconnects 108. It is understood that although the external interconnects 108 are shown in a dual row configuration, it is understood that the external interconnects 108 may be in a different configuration, such as a single row or more than dual rows of the external interconnects 108. Further for illustrative purposes, the dual rows of the external interconnects 108 are shown in a staggered configuration, although it is understood that the external interconnects 108 may not be staggered from row to row.

Figure 2:
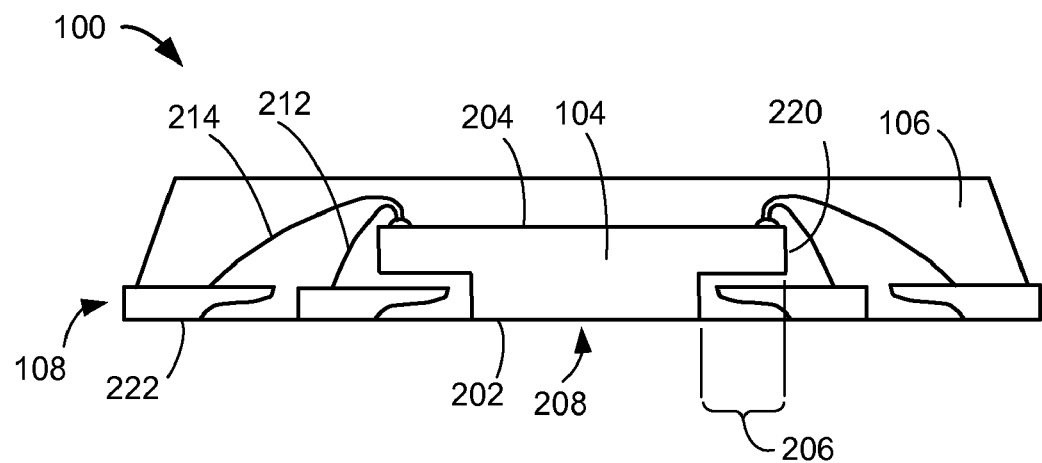
FIG. 2 is a cross-sectional view of the integrated circuit package system along a line 2-2 of FIG. 1.

Referring now to FIG. 2, therein is shown a cross-sectional view of the integrated circuit package system 100 along a line 2-2 of FIG. 1. The cross-sectional view depicts the contoured integrated circuit die 104 positioned between the external interconnects 108. The contoured integrated circuit die 104, such as an integrated circuit die, has a non-active side 202 and an active side 204, wherein the active side 204 includes active circuitry fabricated thereon.

The contoured integrated circuit die 104 is preferably contoured from the non-active side 202, such as by localized backgrinding or sawing from the non-active side 202 to provide extensions 206 over a base portion 208. The contoured integrated circuit die 104 electrically connects to an inner row of the external interconnects 108 with first internal interconnects 212, such as bond wires or ribbon bonds, and to an outer row of the external interconnects 108 with second internal interconnects 214, such as bond wires or ribbon bonds.

The extensions 206 of the contoured integrated circuit die 104 overhang the base portion 208, extending over the external interconnects 108 in a non-coplanar relation, thereby allowing flexibility to accommodate a greater integrated circuit die sizes, such as 30% size increase, than compared to a non-contoured die, which would not otherwise fit into the same physical footprint provided between the external interconnects 108. The package encapsulation 106 encapsulates the contoured integrated circuit die 104, the first internal interconnects 212, and the second internal interconnects 214. For illustrative purposes, the contoured integrated circuit die 104 has the base portion 208 and the extensions 206 in a stepped configuration along edges 220 of the contoured integrated circuit die 104, although it is understood that the contoured integrated circuit die 104 may have the edges 220 in a different configuration.

The package encapsulation 106 is between portions of the extensions 206 extending over or overhanging in the external interconnects 108 and portions of the inner row of the external interconnects 108 facing the overhanging portions of the extension 206 without requiring a separate support structure (not shown) or a die-attach adhesive (not shown). The elimination of the separate support structure and the die-attach adhesive reduces manufacturing complexity and cost. Also, the elimination of a die-attach paddle (not shown) eliminates delamination risk between the package encapsulation 106 and the die-attach paddle improving moisture sensitivity level test (MSL) performance and improving reliability of the integrated circuit package system 100.

The external interconnects 108, such as inner leads and outer leads, are provided by exposing a bottom portion 222 of the external interconnects 108 for connections to the integrated circuit package system 100 with the next system level (not shown), such as a printed circuit board or another integrated circuit device.

Figure 3:
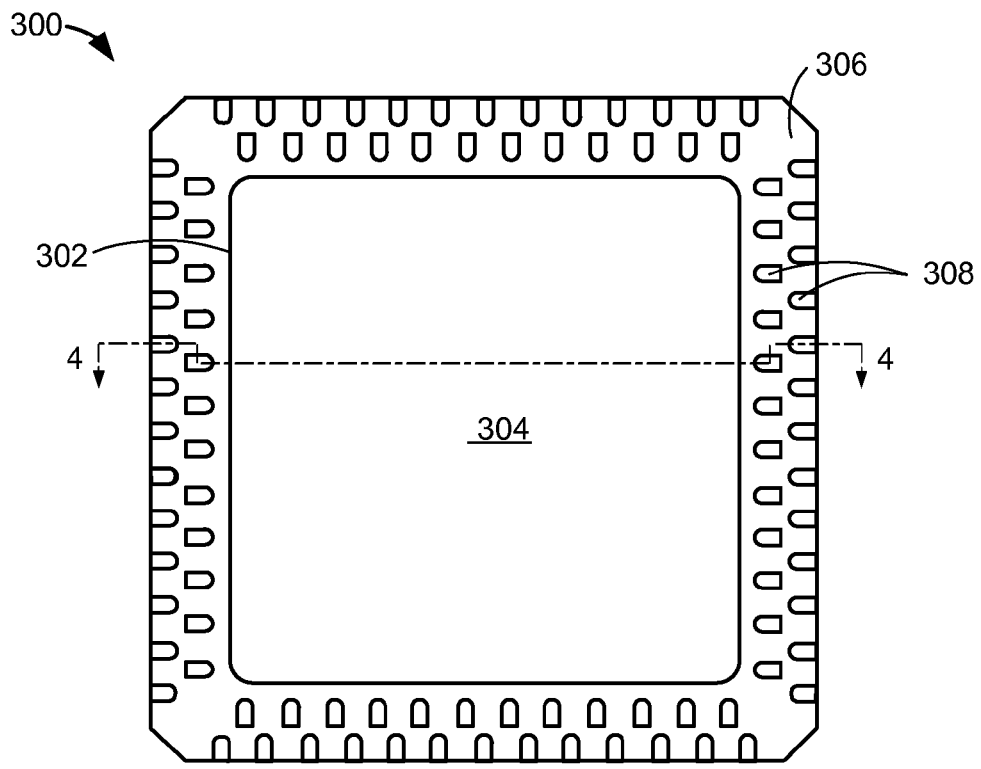
FIG. 3 is a bottom view of an integrated circuit package system in a second embodiment of the present invention.

Referring now to FIG. 3, therein is shown a bottom view of an integrated circuit package system 300 in a second embodiment of the present invention. The bottom view depicts a backside cover 302 of a contoured integrated circuit die 304, surrounded by a package encapsulation 306, such as an epoxy mold compound. The package encapsulation 306 preferably surrounds and exposes dual rows of external interconnects 308, such as leads.

For illustrative purposes, the integrated circuit package system 300 is shown in a dual row configuration, although, it is understood that the external interconnects 308 may be in a different configuration, such as a single row or more than dual rows of the external interconnects 308. Further for illustrative purposes, the dual rows of the external interconnects 308 are shown in a staggered configuration, although it is understood that the external interconnects 308 may not be staggered from row to row.

Figure 4:
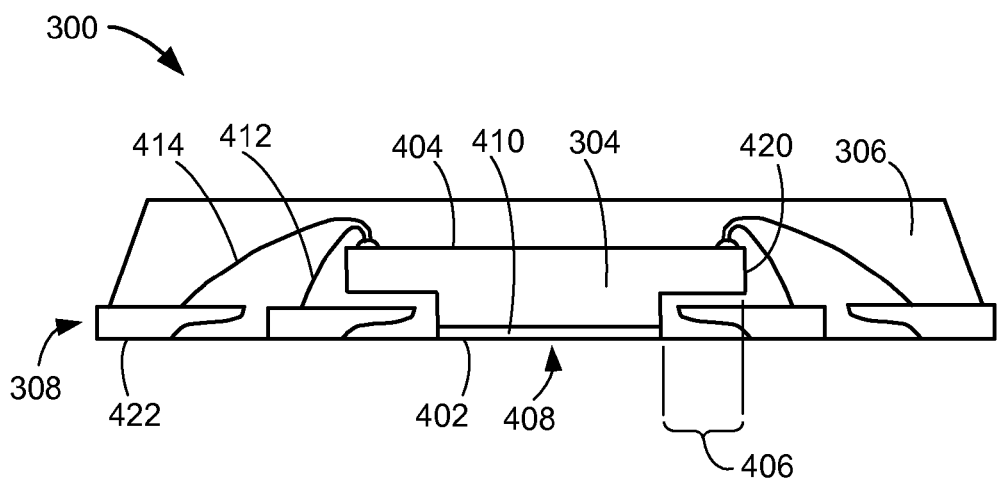
FIG. 4 is a cross-sectional view of the integrated circuit package system along a line 4-4 of FIG. 3.

Referring now to FIG. 4, therein is shown a cross-sectional view of the integrated circuit package system 300 along a line 4-4 of FIG. 3. The cross-sectional view depicts the contoured integrated circuit die 304 positioned between the external interconnects 308. The contoured integrated circuit die 304, such as an integrated circuit die, has a non-active side 402 and an active side 404, wherein the active side 404 includes active circuitry fabricated thereon.

The contoured integrated circuit die 304 is preferably contoured from the non-active side 402, such as by localized backgrinding or sawing from the non-active side 402 to provide extensions 406 over a base portion 408. A backside concealer 410, such as of epoxy layer or a plastic layer, on the non-active side 402 of the contoured integrated circuit die 304 may be provided as needed to protect the contoured integrated circuit die 304. The contoured integrated circuit die 304 electrically connects to an inner row of the external interconnects 308 with first internal interconnects 412, such as bond wires or ribbon bonds, and to an outer row of the external interconnects 308 with second internal interconnects 414, such as bond wires or ribbon bonds.

The extensions 406 of the contoured integrated circuit die 304 overhang the base portion 408, extending over the external interconnects 308 in a non-coplanar relation, thereby allowing flexibility to accommodate a greater integrated circuit die sizes, such as 30% size increase, than compared to a non-contoured die which would not otherwise fit into the same physical footprint provided between the external interconnects 308. The package encapsulation 306 encapsulates the contoured integrated circuit die 304, the first internal interconnects 412, and the second internal interconnects 414. For illustrative purposes, the contoured integrated circuit die 304 has the base portion 408 and the extensions 406 in a stepped configuration along edges 420 of the contoured integrated circuit die 304, although it is understood that the contoured integrated circuit die 304 may have the edges 420 in a different configuration.

The package encapsulation 306 is between the extensions 406 the inner rows of the external interconnects 308 without requiring a separate support structure (not shown) or a die-attach adhesive (not shown). The elimination of the separate support structure and the die-attach adhesive reduces manufacturing complexity and cost. Also, the elimination of a die-attach paddle (not shown) eliminates delamination risk between the package encapsulation 306 and the die-attach paddle improving moisture sensitivity level (MSL) test performance and improving reliability of the integrated circuit package system 300.

The external interconnects 308, such as inner leads and outer leads, are provided by exposing a bottom portion 422 of the external interconnects 308 for connections to the integrated circuit package system 300 with the next system level (not shown), such as a printed circuit board or another integrated circuit device.

Figure 5:
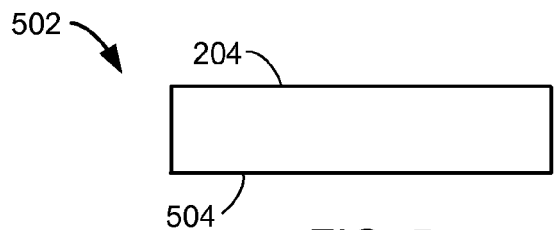
FIG. 5 is the cross-sectional view of an integrated circuit die.

Referring now to FIG. 5, therein is shown a cross-sectional view of an integrated circuit die 502. The integrated circuit die 502 includes a non-contoured non-active side 504 and the active side 204. For illustrative purposes, the integrated circuit die 502 is shown as a single integrated circuit die, although it is understood that the integrated circuit die 502 may represent a wafer (not shown) having a plurality of the integrated circuit die 502.

Figure 6:
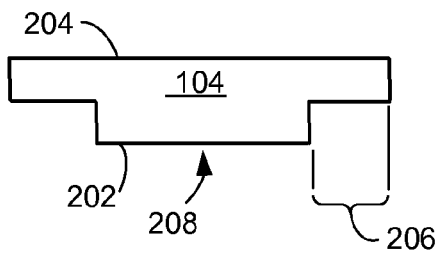
FIG. 6 is the structure of FIG. 5 in forming the contoured integrated circuit die.

Referring now to FIG. 6, therein is shown the structure of FIG. 5 in forming the contoured integrated circuit die 104. The contoured integrated circuit die 104 has the active side 204 having active circuitry thereon and the non-active side 202. The contoured integrated circuit die 104 preferably has the base portion 208 and the extensions 206. The contoured integrated circuit die 104 is contoured from the non-active side 202 to create the extensions 206 overhanging the base portion 208. For example, the integrated circuit die 502 of FIG. 5 may undergo a localized backgrinding or partial cutting from the non-active side 202 without traversing to the active side 204.

For illustrative purposes, the contoured integrated circuit die 104 is shown as a single integrated circuit device, although it is understood that the contoured integrated circuit die 104 may represent be part of a wafer (not shown) having a plurality of the contoured integrated circuit die 104. As such, the wafer may undergo a singulation process separating the contoured integrated circuit die 104.

Figure 7:
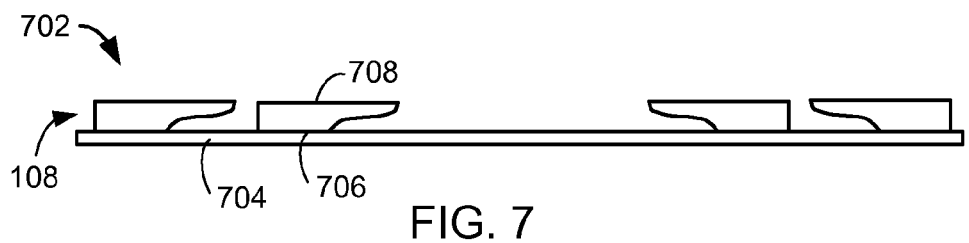
FIG. 7 is a cross-sectional view of a lead frame having the external interconnects on a tape.

Referring now to FIG. 7, therein is shown a cross-sectional view of a lead frame 702 having the external interconnects 108 on a tape 704. The tape 704, such as a coverlay tape, provides a coplanar surface between the inner rows of the external interconnects 108. The tape 704 is attached to a bottom side 706 of the external interconnects 108 with a top side 708 of the external interconnects 108 facing away from the tape 704.

Figure 8:
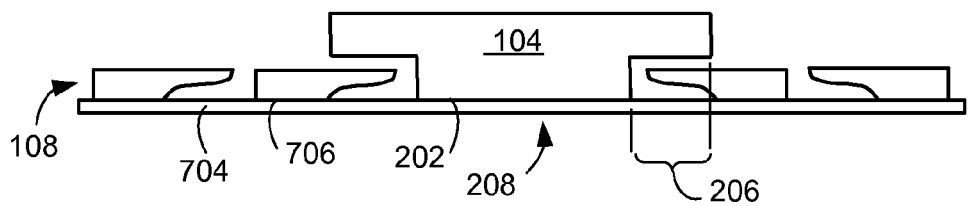
FIG. 8 is the structure of FIG. 7 in a mounting phase of the contoured integrated circuit die.

Referring now to FIG. 8, therein is shown the structure of FIG. 7 in a mounting phase of the contoured integrated circuit die 104. The contoured integrated circuit die 104 mounted to the tape 704 with the non-active side 202 facing the tape 704. The tape 704 provides planar rigidity such that the non-active side 202 and the bottom side 706 of the external interconnects 108 are coplanar. The base portion 208 is between the inner row of the external interconnects 108. The extensions 206 overhang the inner row of the external interconnects 108 without a separate support structure (not shown) or a die-attach adhesive (not shown).

Figure 9:
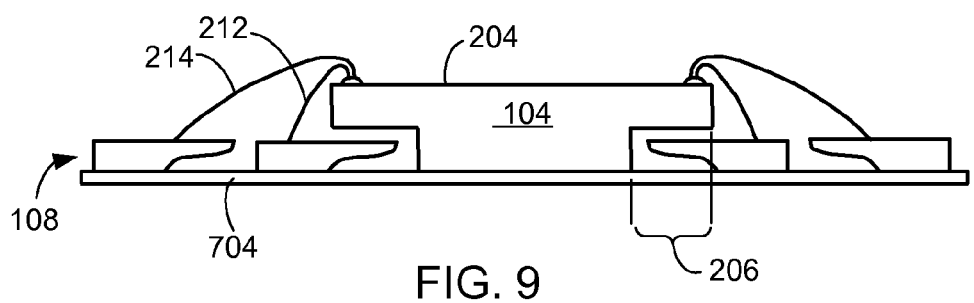
FIG. 9 is the structure of FIG. 8 in a connecting phase of the first internal interconnects and the second internal interconnects.

Referring now to FIG. 9, therein is shown the structure of FIG. 8 in a connecting phase of the first internal interconnects 212 and the second internal interconnects 214. The contoured integrated circuit die 104 is electrically connected to the external interconnects 108 with the first internal interconnects 212 and the second internal interconnects 214. The overhang of the extensions 206 does not impede connections of the first internal interconnects 212 between the active side 204 and the inner row of the external interconnects 108. The tape 704 is attached to the contoured integrated circuit die 104 and the external interconnects 108.

Figure 10:
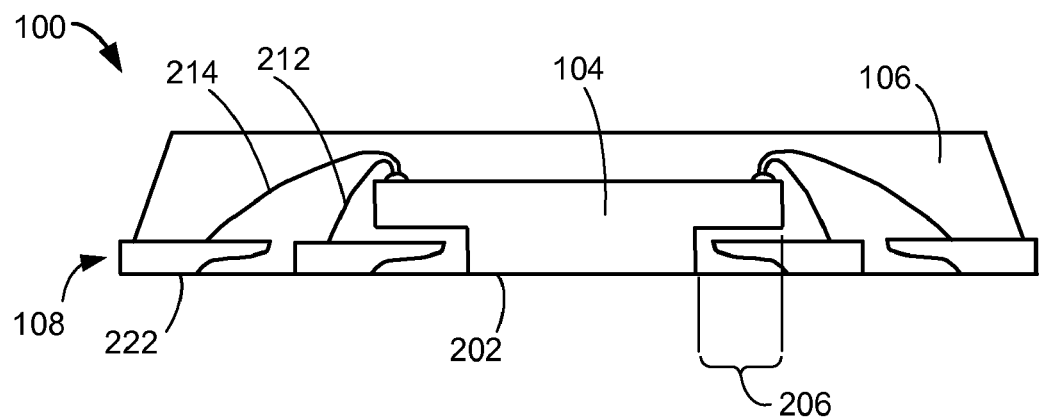
FIG. 10 is the structure of FIG. 9 in a forming phase of the package encapsulation.

Referring now to FIG. 10, therein is shown the structure of FIG. 9 in a forming phase of the package encapsulation 106. The package encapsulation 106 encapsulates the contoured integrated circuit die 104, the external interconnects 108, the first internal interconnects 212, and the second internal interconnects 214. The package encapsulation 106 is between the extensions 206 and the inner row of the external interconnects 108 below the extensions 206.

The tape 704 of FIG. 9 covers the bottom portion 222 of the external interconnects 108 and the non-active side 202 during the molding process for forming the package encapsulation 106. The tape 704 is removed exposing the bottom portion 222 of the external interconnects 108 and the non-active side 202 from the package encapsulation 106. The encapsulated structure may undergo singulation from the lead frame 702 of FIG. 7 forming the integrated circuit package system 100.

Figure 11:
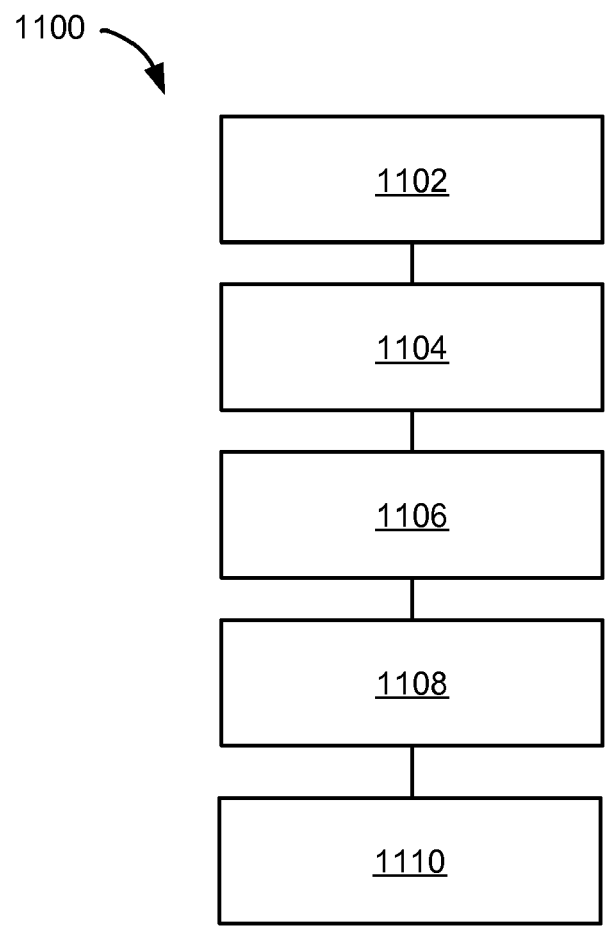
FIG. 11 is a flow chart of an integrated circuit package system for manufacture of the integrated circuit package system in an embodiment of the present invention.

Referring now to FIG. 11, therein is shown a flow chart of an integrated circuit package system 1100 for manufacture of the integrated circuit package system 100 in an embodiment of the present invention. The system 1100 includes forming an external interconnect in a block 1102; providing a contoured integrated circuit die having both an extension and a base portion with the extension extending beyond the base portion in a block 1104; placing the contoured integrated circuit die with the base portion coplanar with the external interconnect and the extension overhanging the external interconnect in a block 1106; connecting the contoured integrated circuit die and the external interconnect in a block 1108; and forming a package encapsulation over the contoured integrated circuit die and the external interconnect with both partially exposed in a block 1110.

Yet another important aspect of the embodiments is it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
forming an external interconnect;
providing a contoured integrated circuit die having both an extension and a base portion with the extension extending beyond the base portion;
placing the contoured integrated circuit die with the base portion coplanar with the external interconnect and the extension overhanging the external interconnect;
connecting the contoured integrated circuit die and the external interconnect; and
forming a package encapsulation over the contoured integrated circuit die and the external interconnect with both partially exposed, the package encapsulation between the overhanging portion of the extension and facing portions of the external interconnect.

2. The system as claimed in claim 1 wherein providing the contoured integrated circuit die having both the extension and the base portion includes partially cutting a non-active side of the contoured integrated circuit die to create the base portion and the extension.

3. The system as claimed in claim 1 wherein:
providing the contoured integrated circuit die having both the extension and the base portion includes:
forming the base portion from a non-active side of the contoured integrated circuit die with the extension along an active side of the contoured integrated circuit die; and
forming the package encapsulation further includes:
exposing the non-active side.

4. The system as claimed in claim 1 wherein:
providing the contoured integrated circuit die having both the extension and the base portion includes:
forming the base portion from a non-active side of the contoured integrated circuit die with the extension along an active side of the contoured integrated circuit die;
forming a backside concealer on the non-active side; and
forming the package encapsulation includes:
exposing the backside concealer.

5. The system as claimed in claim 1 wherein forming the package encapsulation includes supporting the extension without a separate support structure.

6. An integrated circuit package system comprising:
forming an external interconnect having a bottom side and a top side;
providing a contoured integrated circuit die includes:
providing a non-active side and an active side,
providing an extension along the active side, and
providing a base portion along the non-active side with the extension extending beyond the base portion;
placing the contoured integrated circuit die with the base portion coplanar with the bottom side and the extension overhanging the top side;
connecting the contoured integrated circuit die and the external interconnect; and
forming a package encapsulation over the contoured integrated circuit die and the external interconnect with both partially exposed, the package encapsulation between the overhanging portion of the extension and facing portions of the external interconnect.

7. The system as claimed in claim 6 wherein providing the contoured integrated circuit die includes forming an edge of the contoured integrated circuit die in a stepped configuration.

8. The system as claimed in claim 6 wherein placing the contoured integrated circuit die includes placing the non-active side coplanar with the bottom side.

9. The system as claimed in claim 6 wherein forming the package encapsulation includes exposing the base portion of the non-active side.

10. The system as claimed in claim 6 wherein forming the package encapsulation includes exposing the bottom side.

11. An integrated circuit package system comprising:
an external interconnect;
a contoured integrated circuit die having both an extension and a base portion with the extension extending beyond the base portion with the base portion coplanar with the external interconnect and the extension overhanging the external interconnect;
an internal interconnect between the contoured integrated circuit die and the external interconnect; and
a package encapsulation over the contoured integrated circuit die and the external interconnect with both partially exposed, the package encapsulation between the overhanging portion of the extension and facing portions of the external interconnect.

12. The system as claimed in claim 11 wherein the contoured integrated circuit die includes a non-active side of the contoured integrated circuit die partially cut to create the base portion and the extension.

13. The system as claimed in claim 11 wherein:
the contoured integrated circuit die having both the extension and the base portion includes:
the base portion in a non-active side of the contoured integrated circuit die;
the extension along an active side of the contoured integrated circuit die; and
the package encapsulation further includes:
the non-active side exposed.

14. The system as claimed in claim 11 wherein:
the contoured integrated circuit die having both the extension and the base portion includes:
the base portion in a non-active side of the contoured integrated circuit die;
the extension along an active side of the contoured integrated circuit die;
a backside concealer on the non-active side; and
the package encapsulation includes:
the backside concealer exposed.

15. The system as claimed in claim 11 wherein the package encapsulation is between the extension and the external interconnect below the extension without a separate support structure.

16. The system as claimed in claim 11 wherein:
the external interconnect has a bottom side and a top side;
the contoured integrated circuit die has a non-active side and an active side includes:

the extension along the active side, and
the base portion along the non-active side with the extension extending beyond the base portion;
the internal interconnect is a wire; and
the package encapsulation exposes the non-active side and the bottom side.

17. The system as claimed in claim 16 wherein the contoured integrated circuit die includes an edge of the contoured integrated circuit die in a stepped configuration.

18. The system as claimed in claim 16 wherein the contoured integrated circuit die includes the non-active side coplanar with the bottom side.

19. The system as claimed in claim 16 wherein the package encapsulation exposes the base portion of the non-active side.

20. The system as claimed in claim 16 wherein the package encapsulation exposes the bottom side.

* * * * *